United States Patent
Wang et al.

(10) Patent No.: US 12,148,655 B2
(45) Date of Patent: Nov. 19, 2024

(54) METHODS FOR FORMING STAIRS IN THREE-DIMENSIONAL MEMORY DEVICES

(71) Applicant: YANGTZE MEMORY TECHNOLOGIES CO., LTD., Wuhan (CN)

(72) Inventors: Xiangning Wang, Wuhan (CN); Bin Yuan, Wuhan (CN); Chen Zuo, Wuhan (CN); Zhu Yang, Wuhan (CN); Zongke Xu, Wuhan (CN)

(73) Assignee: YANGTZE MEMORY TECHNOLOGIES CO., LTD., Wuhan (CN)

(*) Notice: Subject to any disclaimer, the term of this patent is extended or adjusted under 35 U.S.C. 154(b) by 839 days.

(21) Appl. No.: 17/162,937

(22) Filed: Jan. 29, 2021

(65) Prior Publication Data
US 2022/0223469 A1 Jul. 14, 2022

Related U.S. Application Data

(63) Continuation of application No. PCT/CN2021/071445, filed on Jan. 13, 2021.

(51) Int. Cl.
*H01L 21/768* (2006.01)
*H01L 23/522* (2006.01)
(Continued)

(52) U.S. Cl.
CPC .. *H01L 21/76816* (2013.01); *H01L 21/76877* (2013.01); *H01L 23/5226* (2013.01);
(Continued)

(58) Field of Classification Search
CPC ......... H01L 21/76816; H01L 21/76877; H01L 23/5226; H01L 23/5283; H10B 41/27; H10B 43/27
(Continued)

(56) References Cited

U.S. PATENT DOCUMENTS

2010/0308444 A1* 12/2010 Hung ............... H01L 23/642
257/E21.573
2016/0163546 A1* 6/2016 Godet ............... H01L 21/0332
257/623
(Continued)

FOREIGN PATENT DOCUMENTS

CN 111033729 A 4/2020
TW 202023038 A 6/2020

OTHER PUBLICATIONS

International Search Report issued in corresponding International Application No. PCT/CN2021/071445, Oct. 12, 2021, 5 pages.

*Primary Examiner* — Nduka E Ojeh
*Assistant Examiner* — Eric W Jones
(74) *Attorney, Agent, or Firm* — BAYES PLLC

(57) ABSTRACT

The present disclosure provides a method for forming a three-dimensional (3D) memory. In an example, the method includes forming a stack structure having interleaved a plurality of stack first layers and a plurality of stack second layers, forming a stair in the stack structure, the stair having one of the stack first layers on a top surface, and forming a layer of sacrificial material having a first portion over a side surface of the stair and a second portion over the top surface of the stair. The method also includes partially removing the first portion of the layer of sacrificial material using an anisotropic etching process and removing a remaining portion of the first portion of the layer of sacrificial material using an isotropic etching process.

20 Claims, 11 Drawing Sheets

(51) Int. Cl.
  *H01L 23/528* (2006.01)
  *H10B 41/27* (2023.01)
  *H10B 43/27* (2023.01)
(52) U.S. Cl.
  CPC ......... *H01L 23/5283* (2013.01); *H10B 41/27* (2023.02); *H10B 43/27* (2023.02)
(58) Field of Classification Search
  USPC ........................................................ 257/314
  See application file for complete search history.

(56) References Cited

U.S. PATENT DOCUMENTS

| | | | |
|---|---|---|---|
| 2017/0117222 A1 | 4/2017 | Kim et al. | |
| 2017/0154776 A1* | 6/2017 | Godet | ............. H01L 21/823431 |
| 2018/0301460 A1* | 10/2018 | Yoo | ..................... H01L 21/0234 |
| 2018/0330985 A1 | 11/2018 | Yu et al. | |
| 2019/0081070 A1* | 3/2019 | Lu | ...................... H01L 21/31144 |
| 2019/0148398 A1 | 5/2019 | Kim et al. | |
| 2019/0206726 A1* | 7/2019 | Williamson | ...... H01L 21/76816 |
| 2019/0355738 A1* | 11/2019 | Zhao | ....................... H10B 41/27 |
| 2019/0363006 A1 | 11/2019 | Min | |
| 2020/0152654 A1 | 5/2020 | Hwang et al. | |
| 2020/0194305 A1* | 6/2020 | Williamson | ........... H10B 43/27 |
| 2022/0278051 A1* | 9/2022 | Scarbrough | ............ H10B 43/27 |

* cited by examiner

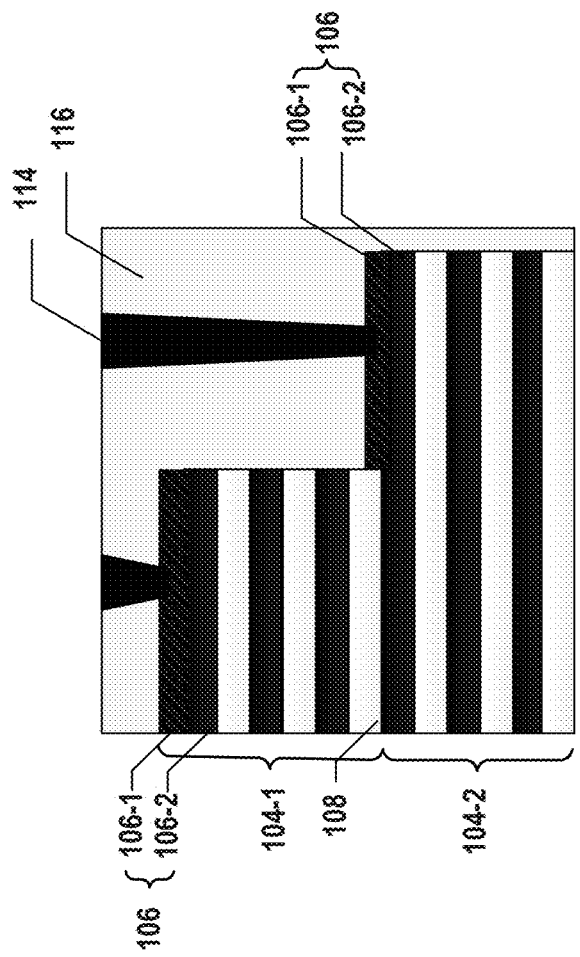
FIG. 1B
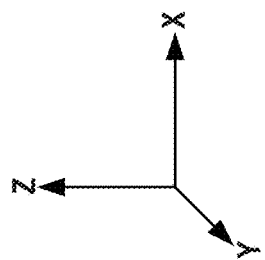

METHODS FOR FORMING STAIRS IN THREE-DIMENSIONAL MEMORY DEVICES

CROSS-REFERENCE TO RELATED APPLICATIONS

This application is continuation of International Application No. PCT/CN2021/071445, filed on Jan. 13, 2021, entitled "METHODS FOR FORMING STAIRS IN THREE-DIMENSIONAL MEMORY DEVICES," which is hereby incorporated by reference in its entirety.

BACKGROUND

The present disclosure relates to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY

Implementations of 3D memory devices and fabrication methods thereof are disclosed herein.

In one example, a method for forming a 3D memory device is provided. The method includes forming a stack structure having interleaved a plurality of stack first layers and a plurality of stack second layers, forming a stair in the stack structure, the stair having one of the stack first layers on a top surface, and forming a layer of sacrificial material having a first portion over a side surface of the stair and a second portion over the top surface of the stair. The method also includes partially removing the first portion of the layer of sacrificial material using an anisotropic etching process and removing a remaining portion of the first portion of the layer of sacrificial material using an isotropic etching process.

In another example, a method for forming a 3D memory device is provided. The method includes forming a stack structure having a plurality of stairs that includes interleaved a plurality of stack first layers and a plurality of stack second layers. Each of the stairs includes one of the stack first layers on a top surface. The method also includes forming a layer of sacrificial material having a first portion over a side surface of the stair and a second portion over the top surface of the stair, and removing, using at least an isotropic etching process, the first portion of the layer of sacrificial material to expose the side surface of the stair. The method further includes retaining the second portion of the layer of sacrificial material in the isotropic etching process.

In still another example, a 3D memory device having a memory stack is provided. The memory stack includes a plurality of stairs each including interleaved one or more conductive layers and one or more dielectric layers. Each of the stairs includes one of the conductive layers on a top surface of the stair, the one of the conductive layers having a top portion and a bottom portion in contact with the top portion and one of the dielectric layers in the respective stair. The bottom portion in the respective stair has a same thickness with the stack conductive layer beyond the respective stair.

BRIEF DESCRIPTION OF THE DRAWINGS

The accompanying drawings, which are incorporated herein and form a part of the specification, illustrate implementations of the present disclosure and, together with the description, further serve to explain the principles of the present disclosure and to enable a person skilled in the pertinent art to make and use the present disclosure.

FIG. 1B illustrates a cross-sectional view of a plurality of stairs, according to some implementations of the present disclosure.

Figure 1A:
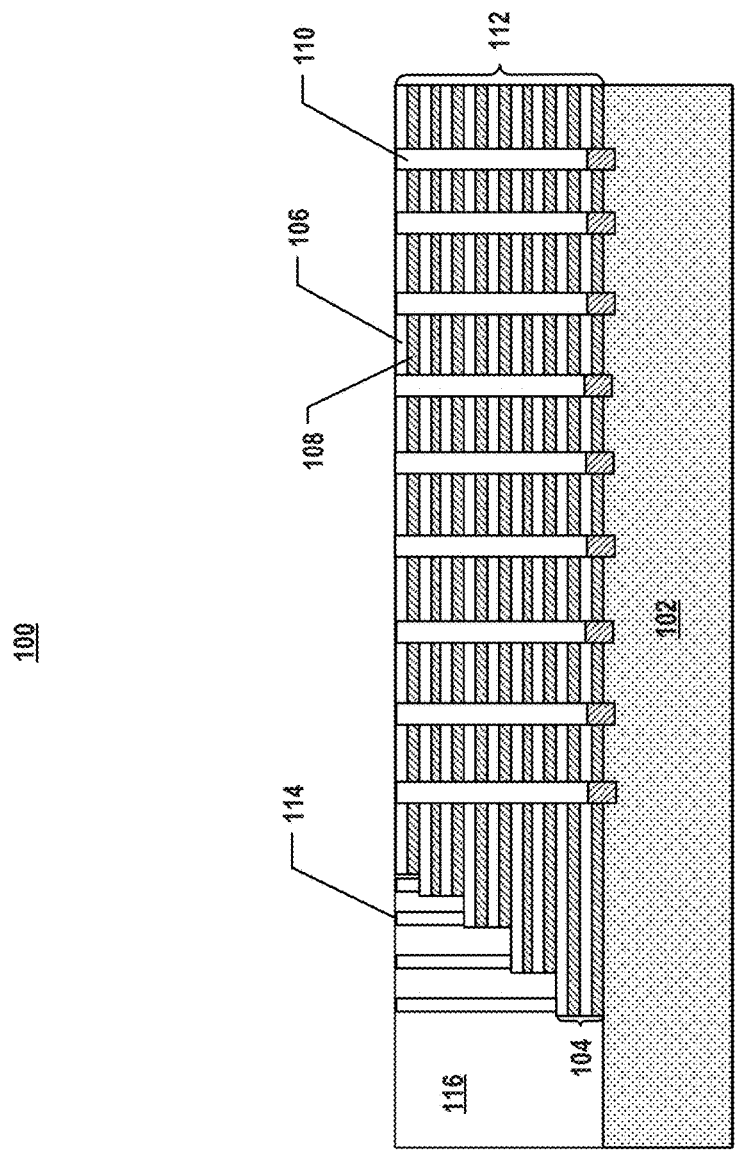
FIG. 1A illustrates a schematic view of a 3D memory device having a plurality of stairs.
Figure 1A:
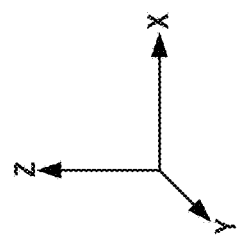

Implementations of the present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present discloses.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations), and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "3D memory string" refers to a vertically-oriented string of memory cell transistors connected in series on a laterally-oriented substrate so that the string of memory cell transistors extends in the vertical direction with respect to the substrate. As used herein, the term "vertical/vertically" means perpendicular to the lateral surface of a substrate.

As used herein, the terms "stair," "step," and "level" can be used interchangeably. As used herein, a staircase structure refers to a set of surfaces that include at least two horizontal surfaces and at least two vertical surfaces such that each horizontal surface is adjoined to a first vertical surface that extends upward from a first edge of the horizontal surface and is adjoined to a second vertical surface that extends downward from a second edge of the horizontal surface. A "stair" refers to a vertical shift in the height of a set of adjoined surfaces. A "staircase structure" refers a structure having a plurality of stairs extending vertically and laterally.

Staircase structures have been introduced into 3D memory devices as the demand for higher memory capacity continues to increase. A 3D memory device, in which memory cells are distributed vertically and laterally, can have a desired number of stairs/levels (e.g., 32, 64, and 96) along the vertical direction. Often, a 3D memory device can be formed by first forming a staircase structure having a plurality of stairs, each stair having one or more sacrificial/ dielectric layers. The sacrificial layers are then replaced with conductive layers, on which contacts are formed to conductively connect the conductive layers to a peripheral circuit. As 3D memory devices continue to scale up vertically (e.g., having 90-levels or more), thinner sacrificial/dielectric layer pairs are used. The thinner sacrificial layers can result in thinner conductive layers.

It can be difficult for the thinner conductive layers to serve as the etch-stop layer in the formation of the contacts (e.g., word line contacts), which are often formed by patterning the insulating structure over the staircase structure to form openings that extend in the insulating structure and expose the conductive layers. As a remedy, conductive layers in contact with the contacts are thickened. One way is to form a sacrificial portion on the sacrificial layer on the top surface of each stair. The sacrificial portion and the sacrificial layer can together be replaced with a conductive layer that has a desired thickness. The sacrificial portion is often formed by depositing a layer of the sacrificial material, e.g., silicon nitride, on the sacrificial layers. The layer of sacrificial material is then patterned to remove the portions on the side surfaces of the stairs. The portions of the layer on the top surfaces of the stairs are retained to form the sacrificial portions. The sacrificial material on the top surfaces of the stairs can thus be thickened by forming the sacrificial portions each on a sacrificial layer. The sacrificial portions and the sacrificial layers are then replaced with a plurality of conductive layers. The conductive layers can thus have a greater thickness on the top surfaces of the stairs, e.g., than without a thickening process. However, the fabrication process to remove the sacrificial material on the side surfaces of the stairs can be difficult to control. Often, the sacrificial portions, and even the underlying sacrificial layer sometimes, are damaged by the etching of the sacrificial material on the side surfaces of the stairs, and the damaged sacrificial portions (and damaged sacrificial layers, if any) become thinner or even disconnected. A conductive layer formed from the damaged sacrificial portion and the underlying sacrificial layer can have a reduced thickness, resulting in undesirably high resistance and impairing the device performance. The fabrication method to form stairs in a 3D memory device needs to be improved.

Figure 4A:
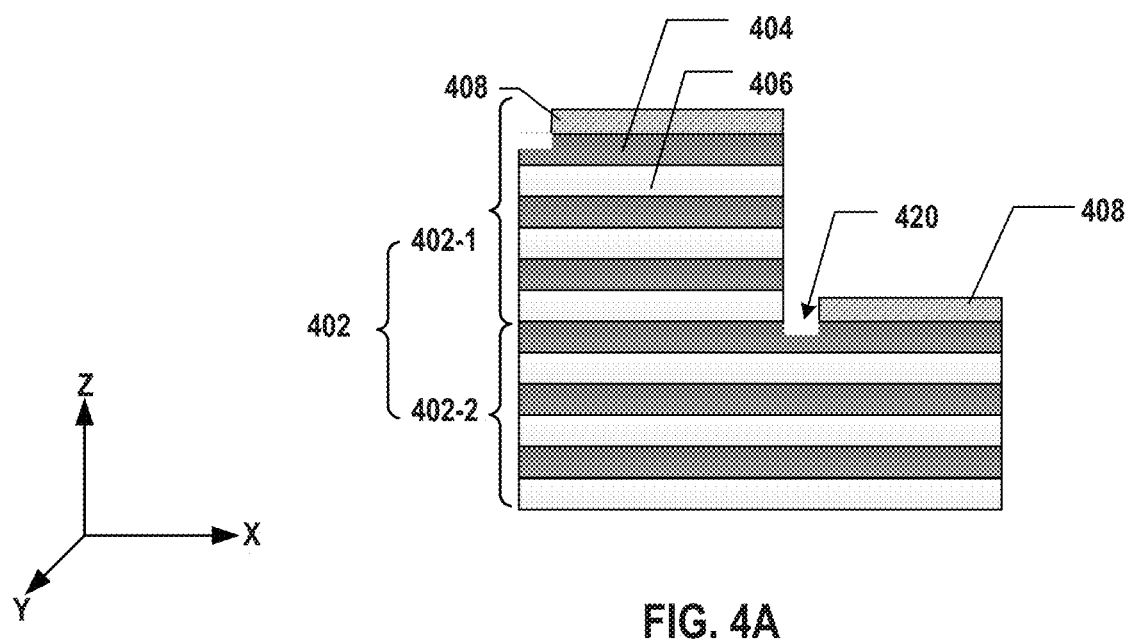
FIGS. 4A and 4B illustrate a method for forming stairs in a 3D memory device.
Figure 4B:
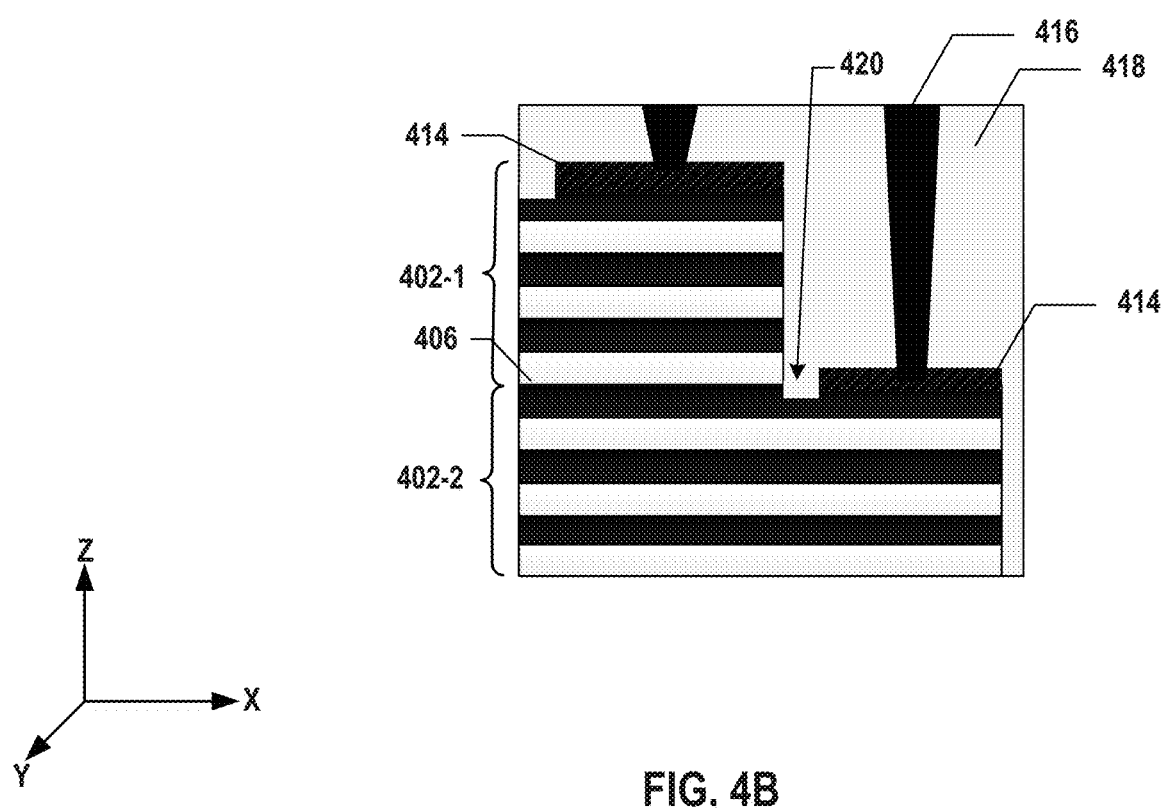

FIGS. 4A and 4B illustrate a 3D memory device. Specifically, FIG. 4A illustrates the 3D memory device before a gated-replacement process that forms the conductive layers, and FIG. 4B illustrates the 3D memory device after the gated-replacement process. As shown in FIG. 4A, the 3D memory device includes a stack structure 402 having a plurality of stairs, e.g., 402-1 and 402-2, extending in the x-axis. Each stair 402-1/402-2 includes one or more stack sacrificial layers 404 and one or more stack dielectric layers 406 interleaved in the z-axis. A sacrificial portion 408 is formed on each stair 402-1/402-2, in contact with stack sacrificial layer 404 on the top surface. Sacrificial portion 408 and stack sacrificial layer 404 often include the same material, e.g., silicon nitride. Stack dielectric layer 406 often includes silicon oxide. A total thickness of sacrificial portion 408 and stack sacrificial layer 404, on the top surface of each stair 402-1/402-2, is thus greater than the thickness of stack sacrificial layer 404 alone. A gate-replacement process is performed to replace each sacrificial portion 408 and the respective stack sacrificial layer 404 into a conductive layer 414, as shown in FIG. 4B. An insulating structure 418 is formed over stack structure 402, and a plurality of contacts 416 are formed in insulating structure 418, each landed on a respective stair.

As previously described, sacrificial portions 408 are formed by patterning a layer of sacrificial material over stack structure 402. In the patterning process, the portions of the layer on the side surfaces of stairs 402-1/402-2 are etched away, often by a dry etching process. The portions of the layer on the top surfaces of stairs 402-1/402-2 are retained to form sacrificial portions 408. As shown in FIGS. 4A and 4B, due to the difficulty in etch control, stack sacrificial layer 404 on the top surface of the respective stair 402-1/402-2 and neighboring the side surface of the immediate-upper stair is often over etched. The over etch causes a void 420 to be formed in sacrificial portion 408 and stack sacrificial layer 404 of each stair (e.g., 402-2). Void 420 causes stack sacrificial layer 404 to become thinner or even disconnected in the region neighboring the immediate-upper stair (e.g., 402-1). After the gate-replacement process, conductive layers 414 formed by stack sacrificial layer 404 on the top surface of each stair (e.g., 402-2) and the respective sacrificial portion 408 also become thinner in the region neighboring the immediate-upper stair (e.g., 402-1). The reduction in thicknesses of conductive layers 414 can cause the resistance of these conductive layers 414 to increase, impairing the performance of the 3D memory device. The challenge in etch control can also narrow the process window to form a 3D memory device without such a defect.

Various implementations in accordance with the present disclosure provide a 3D memory device having a memory stack that includes a plurality of stairs. Each stair has a conductive layer disposed on the top surface and in contact with a contact. The conductive layer on the top surface of the respective stair can have a sufficient thickness to function as an etch-stop layer for the formation of the contact and a more desirable landing area for the respective contact. The conductive layer on the top surface of each stair has little or no damage in the region neighboring the immediate-upper stair, and an increase in the resistance of the conductive layer on the top surface of a stair can be prevented.

Specifically, in a gate-last fabrication process to form a 3D memory device of the present disclosure, conductive layers (e.g., gate electrodes) are formed by replacing the stack sacrificial layers and sacrificial portions with a conductive material. A sacrificial layer having two sub-layers are deposited on the stack sacrificial layer on the top surface of each stair. The two sub-layers may have different etch selectivities in wet etch. In some implementations, the first sub-layer, having a higher wet etch rate, is deposited to be in contact with the stairs, and the second sub-layer, having a lower wet etch rate, is deposited over the first sub-layer. The two sub-layers can be patterned to form the sacrificial portion on each stair. In the patterning process, the portions of the two sub-layers on the side surfaces of the stairs can be removed with a dry etch followed by a wet etch. The different etch selectivities and the two-step etching process may allow the etching of the sub-layers to be better controlled. Little or no void can be formed in the sacrificial portions and/or stack sacrificial layers on the top surfaces of the stairs. Accordingly, the conductive layers formed from the sacrificial portions and the stack sacrificial layers on the top surfaces of the stairs may thus have little or no void. Little or no increase in resistance in these conductive layers is resulted.

In a gate-first fabrication process to form a 3D memory device of the present disclosure, stack conductive layers (e.g., gate electrodes) are deposited with the dielectric layers as part of the stack structure, and no gate-replacement is needed. A layer of conductive material can be deposited on the stack conductive layers on the top surfaces of the stairs and can be patterned to form a plurality of conductive portions, which are each in contact with a respective stack conductive layer. In some implementations, the layer of conductive material includes two sub-layers of different etching selectivities in wet etch. In some implementations, the first sub-layer, having a higher wet etch rate, is deposited to be in contact with the stairs, and the second sub-layer, having a lower wet etch rate, is deposited over the first sub-layer. The two sub-layers are removed in a two-step etching process that includes a dry etch followed by a wet etch. The different etch selectivities and the two-step etching process may allow the etching of the sub-layers to be better controlled. Accordingly, the conductive layers formed from the conductive portions and the stack conductive layers on the top surfaces of the stairs may thus have little or no void. Little or no increase in resistance in these conductive layers is resulted.

In the 3D memory device disclosed in the present disclosure, the conductive layer on the top surface of each stair may include a top portion and a bottom portion in contact with the top portion. The bottom portion may be over an underlying dielectric layer, and the top portion may be in contact with a contact. The top portion of the conductive layer may be formed from the sacrificial portion (in a gate-last process) or a conductive portion (in a gate-first process), and the bottom portion may be formed from a stack sacrificial layer (in a gate-last process) or a stack conductive layer (in a gate-first process). By using the fabrication method of the present disclosure, the top portion may be in contact with the side surface (e.g., a dielectric layer) of an immediate-upper stair, instead of being separated from the side surface by a void in a 3D memory device. In some implementations, the width of the top portion is the same as the width of the respective stair in a lateral direction the stairs extend.

FIG. 1A illustrates a 3D memory device 100 having a memory stack 112 above a substrate 102. Memory stack 112 may include interleaved a plurality of conductive layers 106 and a plurality dielectric layers 108, and a plurality of 3D memory strings 110 extending in memory stack 112 into substrate 102. 3D memory device 100 may also include an insulating structure 116 in which memory stack 112 is positioned and a plurality of contacts 114 extending in an insulating structure 116 and in contact with respective conductive layers 106. It is noted that x-, y-, and z-axes are added in FIGS. 1A, 1B, and 2A-2J to further illustrate the spatial relationship of the components in the structures/devices. For example, substrate 102 includes two lateral surfaces (e.g., a top surface and a bottom surface) extending laterally in the x- and y-axes (the lateral directions). As used herein, whether one component (e.g., a layer or a device) is "on," "above," or "below" another component (e.g., a layer or a device) of a semiconductor device (e.g., 3D memory device 100) is determined relative to the substrate of the semiconductor device (e.g., substrate 102) in the z-axis (the vertical direction or thickness direction) when the substrate is positioned in the lowest plane of the semiconductor device in the z-axis. The same notion for describing the spatial relationship is applied throughout the present disclosure.

In some implementations, substrate 102 includes silicon (e.g., single crystalline silicon, c-Si), silicon germanium (SiGe), gallium arsenide (GaAs), germanium (Ge), silicon on insulator (SOI), or any other suitable materials. In some implementations, insulating structure 116 includes silicon oxide. In some implementations, contacts 114 includes conductor materials including, but not limited to, W, Co, Cu, Al, doped silicon, silicides, or any combination thereof.

Memory stack 112 may include a plurality of stairs 104, forming a staircase structure. Memory stack 112 may include interleaved a plurality of conductive layers 106 and a plurality of dielectric layers 108 extending in the x- and y-axes, forming a plurality of conductor/dielectric pairs stacking along the z-axis/vertical direction. Interleaved conductive layers 106 and dielectric layers 108 in memory stack 112 can alternate along the vertical direction. In other words, except for the ones at the top or bottom of memory stack 112, each conductive layer 106 can be adjoined by two dielectric layers 108 on both sides, and each dielectric layer 108 can be adjoined by two conductive layers 106 on both sides. Conductive layers 106 can each have the same thickness or different thicknesses. Similarly, dielectric layers 108 can each have the same thickness or different thicknesses. Conductive layers 106 can include conductor materials including, but not limited to, W, Co, Cu, Al, polysilicon (or doped silicon/polysilicon), silicides, or any combination thereof. Dielectric layers 108 can include dielectric materials including, but not limited to, silicon oxide, silicon nitride, silicon oxynitride, or any combination thereof.

The intersection of 3D memory strings 110 and conductive layers 106 can form an array of memory cells in memory stack 112. In some implementations, each 3D memory string 110 is a "charge trap" type of NAND memory string including a semiconductor channel and a memory film. In some implementations, the semiconductor channel includes silicon, such as amorphous silicon, polysilicon, or single crystalline silicon. In some implementations, the memory film is a composite dielectric layer including a tunneling layer, a storage layer (also known as "charge trap/storage layer"), and a blocking layer. Each 3D memory string 110 can have a cylinder shape (e.g., a pillar shape). The semiconductor channel, the tunneling layer, the storage layer, and the blocking layer of memory film are arranged along a direction from the center toward the outer surface of the pillar in this order, according to some implementations. The tunneling layer can include silicon oxide, silicon oxynitride, or any combination thereof. The storage layer can include silicon nitride, silicon oxynitride, silicon, or any combination thereof. The blocking layer can include silicon oxide, silicon oxynitride, high-k dielectrics, or any combination thereof. In one example, the blocking layer can include a composite layer of silicon oxide/silicon oxynitride/silicon oxide (ONO). In another example, the blocking layer can include a high-k dielectric layer, such as aluminum oxide ($Al_2O_3$), hafnium oxide ($HfO_2$) or tantalum oxide ($Ta_2O_5$) layer, and so on.

In some implementations, 3D memory device 100 further includes a plurality of control gates (each being part of a word line). Each conductive layer 106 in memory stack 112 can act as a control gate for each memory cell of 3D memory string 110. In some implementations, each 3D memory string 110 includes two plugs at a respective end in the vertical direction. One plug, at the lower end of 3D memory string 110 and in contact with the semiconductor channel, can include a semiconductor material, such as single-crystal silicon, that is epitaxially grown from substrate 102. The plug can function as the channel controlled by a source select gate of 3D memory string 110. As used herein, the "upper end" of a component (e.g., 3D memory string 110) is the end farther away from substrate 102 in the z-axis, and the "lower end" of the component (e.g., 3D memory string 110) is the end closer to substrate 102 in the z-axis when substrate 102 is positioned in the lowest plane of 3D memory device 100. Another Plug can include semiconductor materials (e.g., polysilicon). By covering the upper end of 3D memory string 110 during the fabrication process, the other plug can function as an etch stop layer to prevent etching of dielectrics filled in 3D memory string 110, such as silicon oxide and silicon nitride. In some implementations, the other plug functions as the drain of 3D memory string 110.

As shown in FIG. 1A, each stair 104 may include one or more conductor/dielectric pairs stacking along the vertical direction. In some implementations, each stair 104 includes conductive layer 106 disposed on the respective top surface to be in contact with the respective contact 114, which is conductively connected to a peripheral circuit (not shown) of memory stack 112.

FIG. 1B illustrates a cross-sectional view of two consecutive stairs 104-1 and 104-2 in 3D memory device 100, according to implementations of the present disclosure. As shown in FIG. 1B, stairs 104-1 and 104-2 may each include one or more conductive layers 106 and one or more dielectric layers 108, interleaved in the z-axis. As an example, each stair 104-1/104-2 includes a plurality of conductive/dielectric layer pairs, with conductive layer 106 on the top surface as a landing area for a respective contact 114. In other implementations, each stair 104-1/104-2 includes one conductive/dielectric layer pair.

Conductive layer 106 on the top surface of each stair 104-1/104-2 may include a top portion 106-1 and a bottom portion 106-2. Top portion 106-1 may be in contact with contact 114, and bottom portion 106-2 may be under and in contact with top portion 106-1. Bottom portion 106-2 may be in contact with an underlying dielectric layer 108. In some implementations, the thickness of the portion of conductive layer 106 on the top surface of the respective stair is greater than the thickness of the rest of conductive layer 106. In some implementations, top portion 106-1 is in contact with the side surface of an immediate-upper stair. For example, top portion 106-1 of conductive layer 106 in stair 104-2 is in contact with dielectric layer 108 (e.g., a bottom dielectric layer) in stair 104-1. In some implementations, in the z-axis, a top surface of conductive layer 106 on the top surface of a stair (e.g., stair 104-2) is located between the top and bottom surface of the bottom dielectric layer 108 of an immediate-upper stair (e.g., stair 104-1). In some implementations, in the x-axis, a lateral dimension (i.e., a width) of top portion 106-1 of conductive layer 106 is the same as a lateral dimension (i.e., a width) of stair 104. In some implementations, little or no void is formed between top portion 106-1 of conductive layer 106 (e.g., of stair 104-2) and the side surface of an immediate-upper stair (e.g., stair 104-1).

Figure 2A:
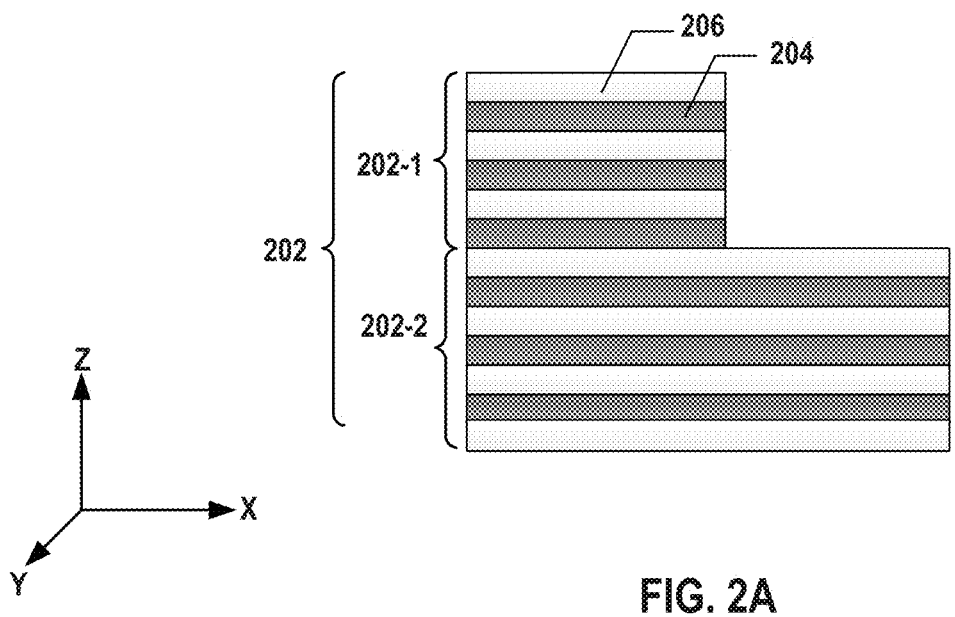
FIGS. 2A-2J illustrate an exemplary method for forming stairs in a 3D memory device, according to some implementations of the present disclosure.
Figure 2B:
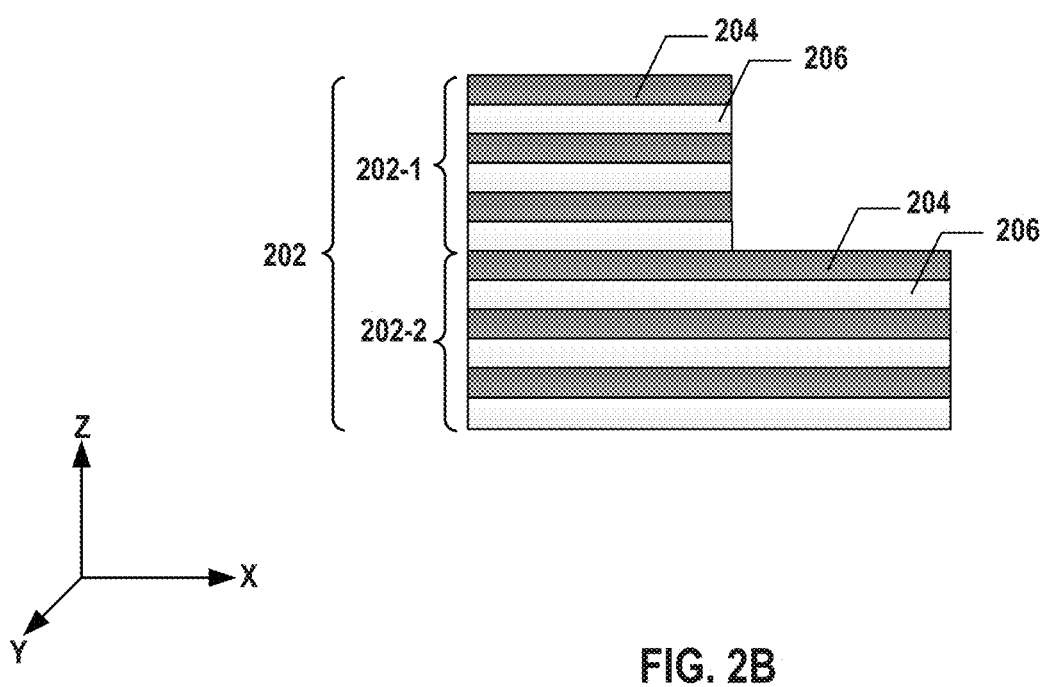
Figure 2C:
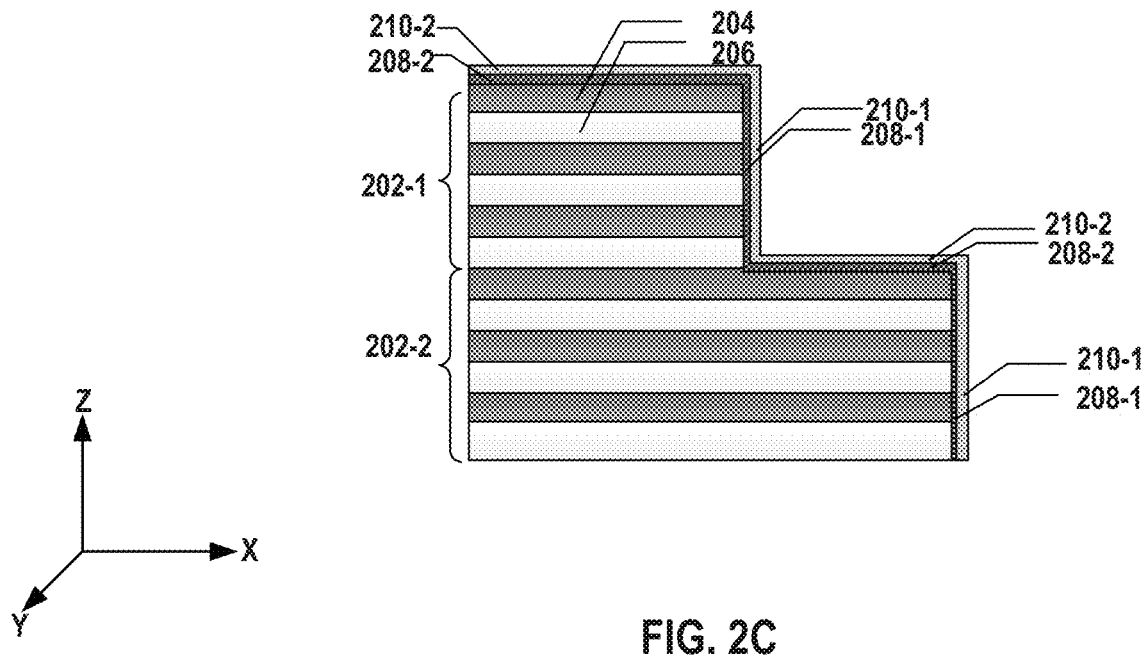
Figure 2D:
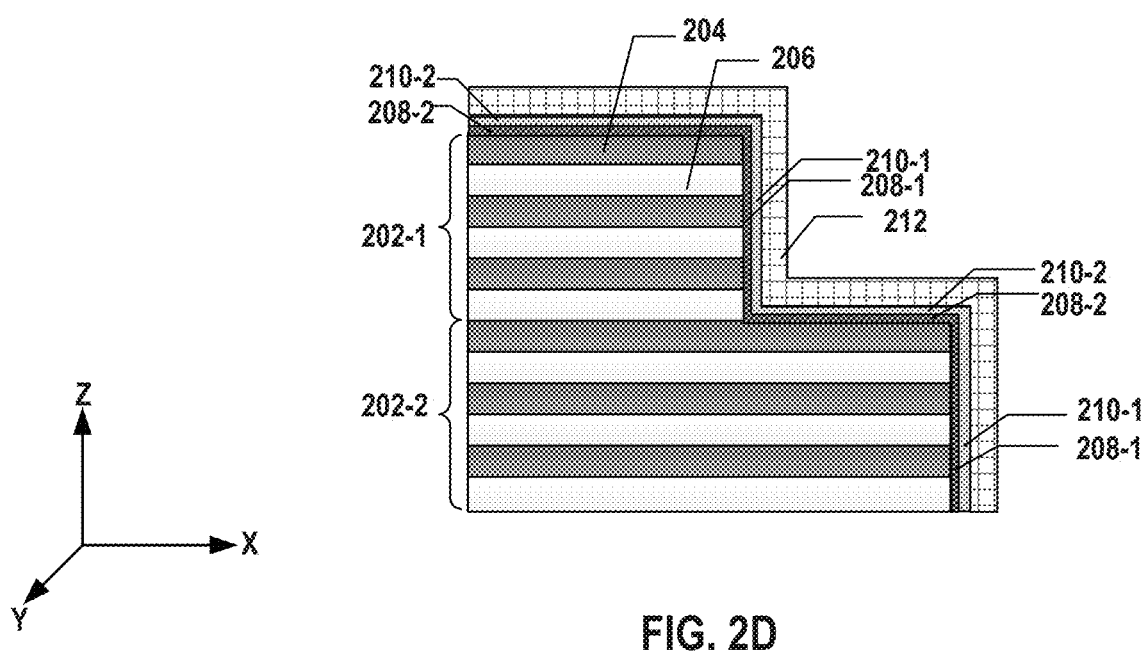
Figure 2E:
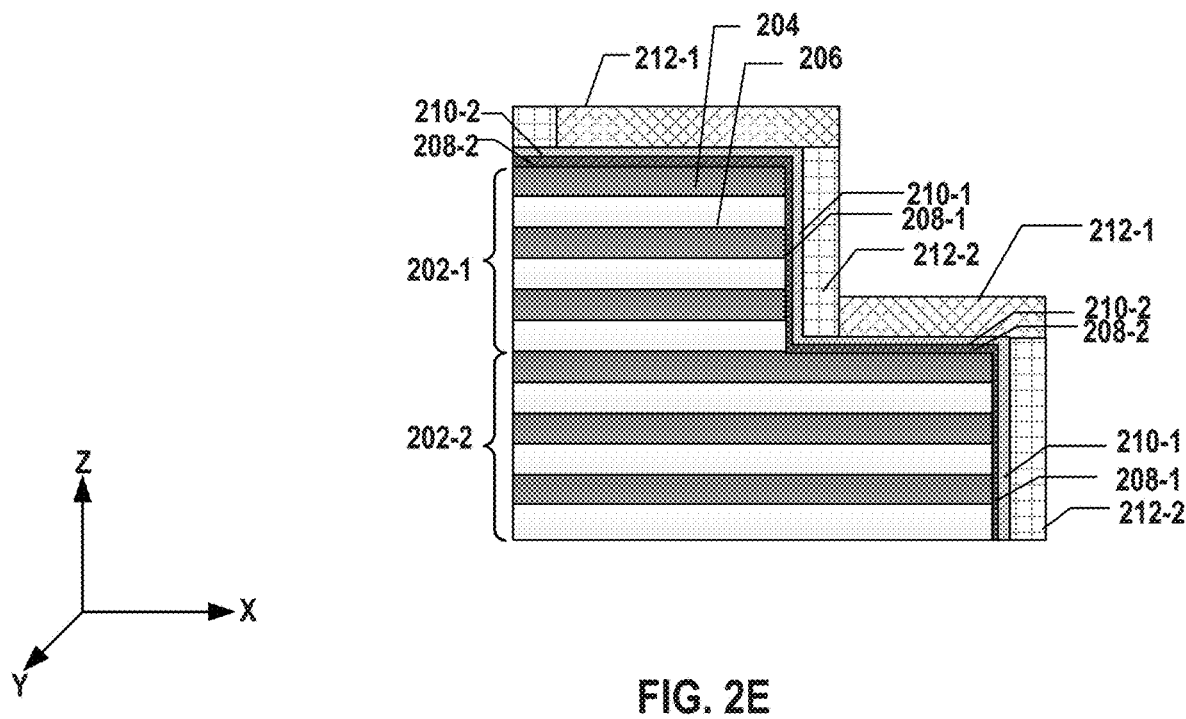
Figure 2F:
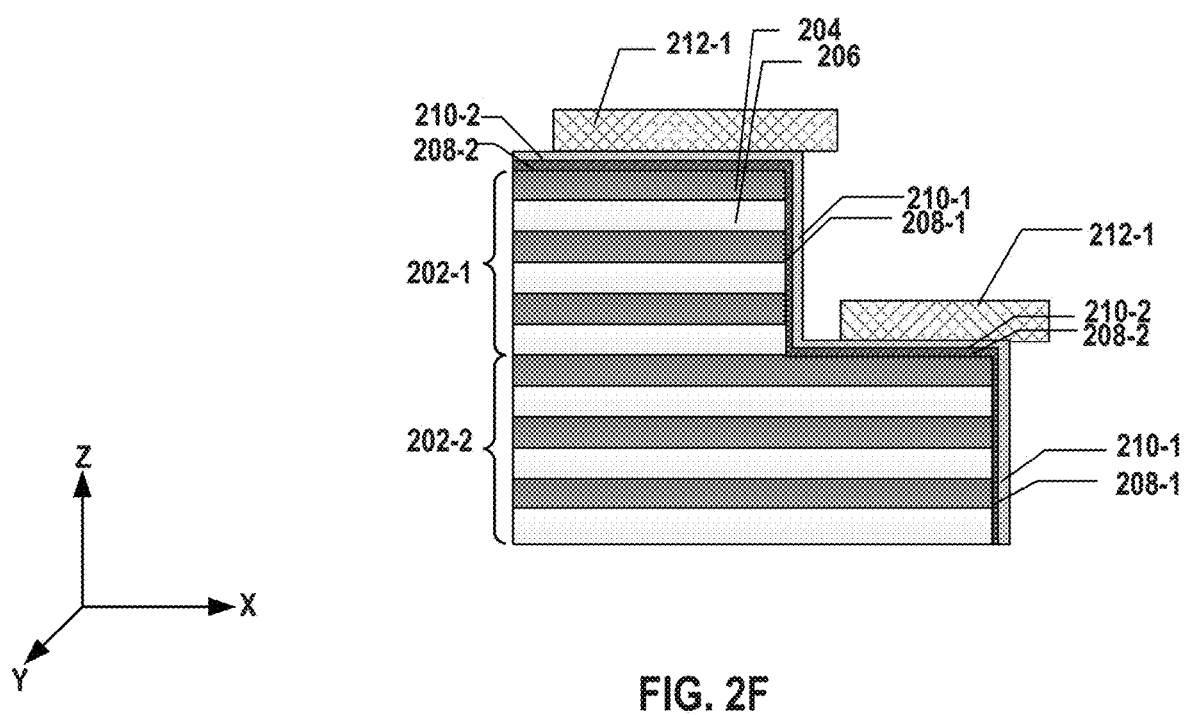
Figure 2G:
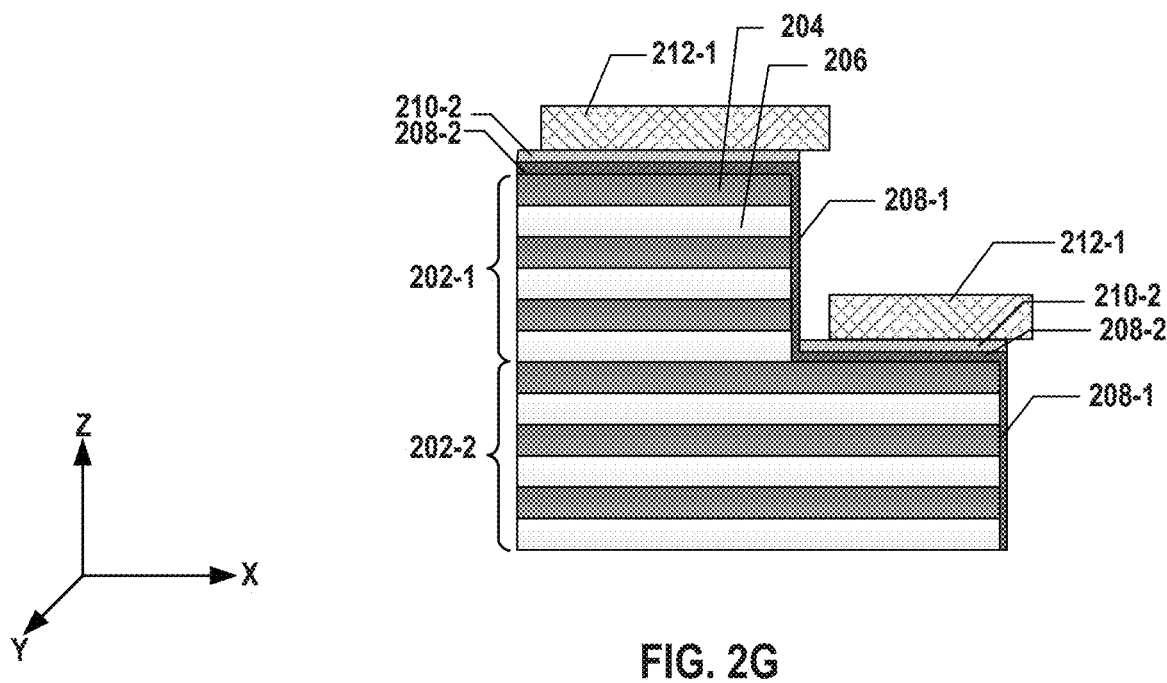
Figure 2H:
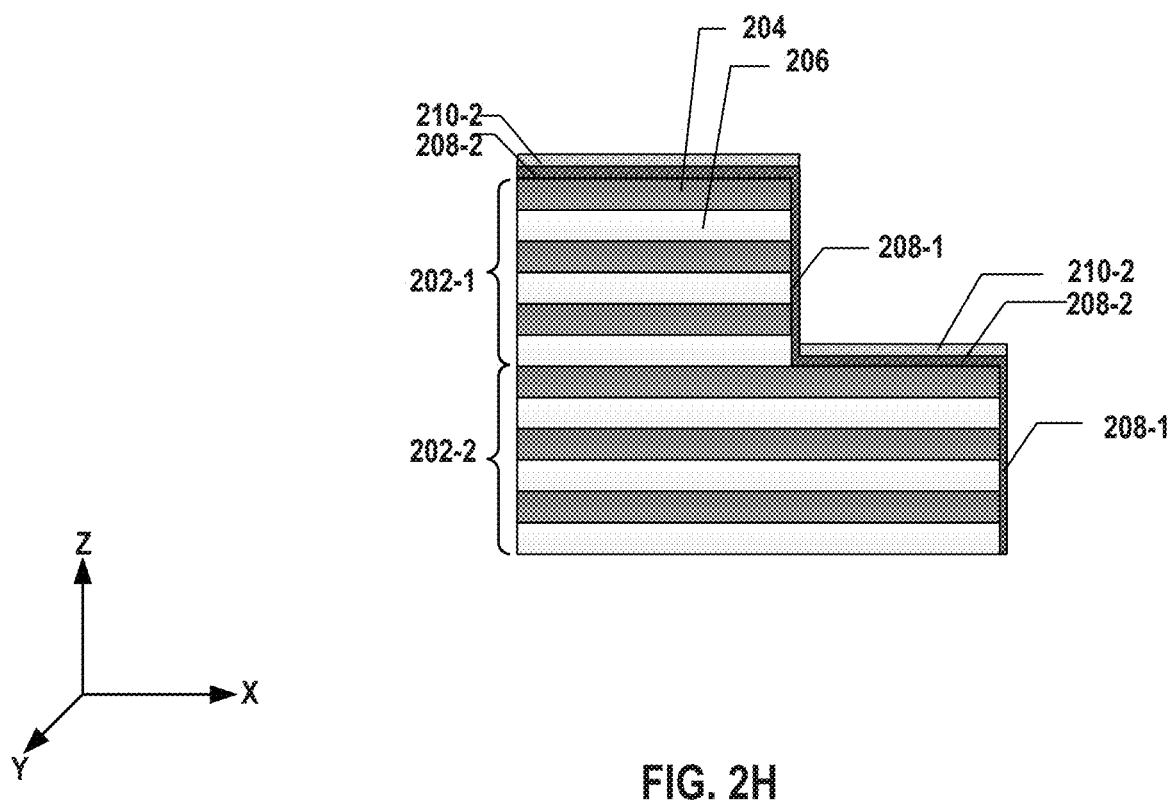
Figure 2I:
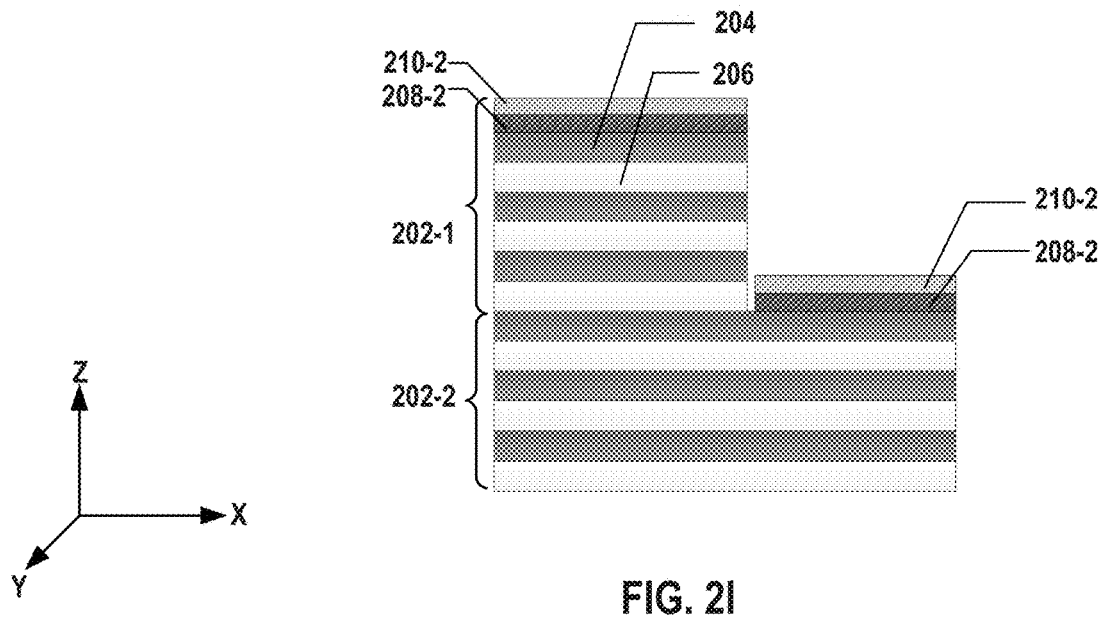
Figure 2J:
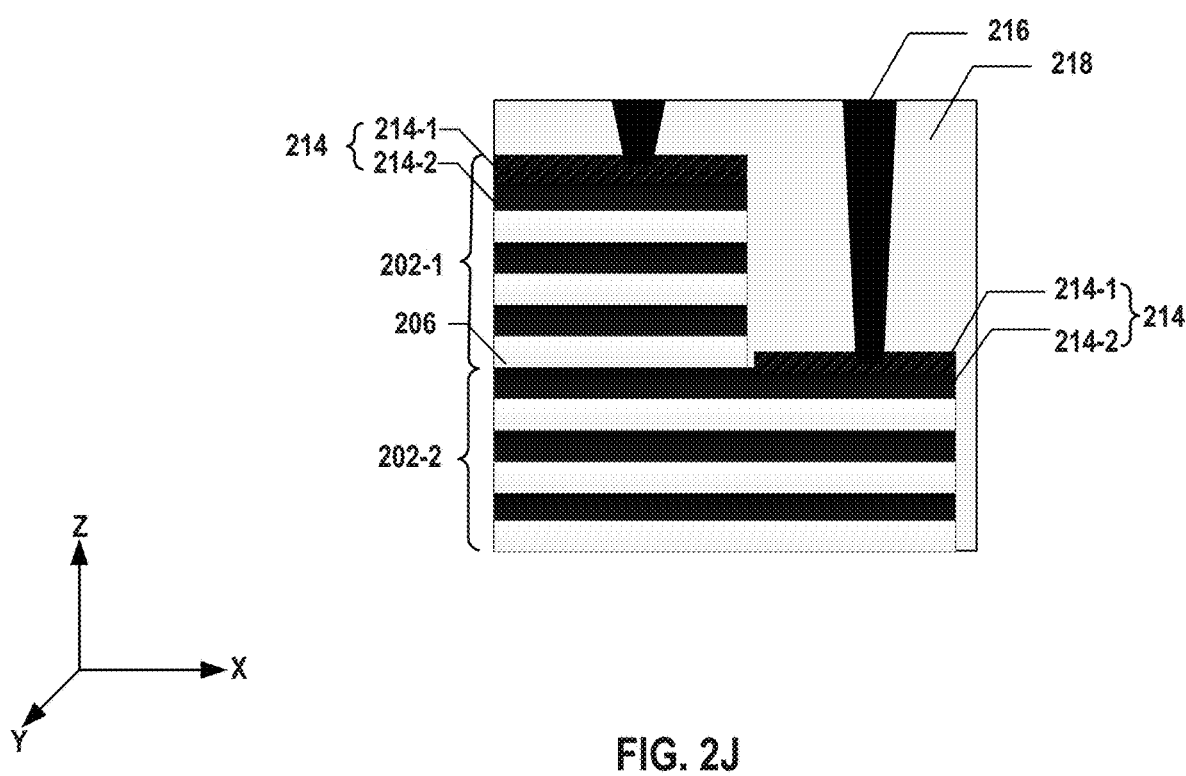
Figure 3:
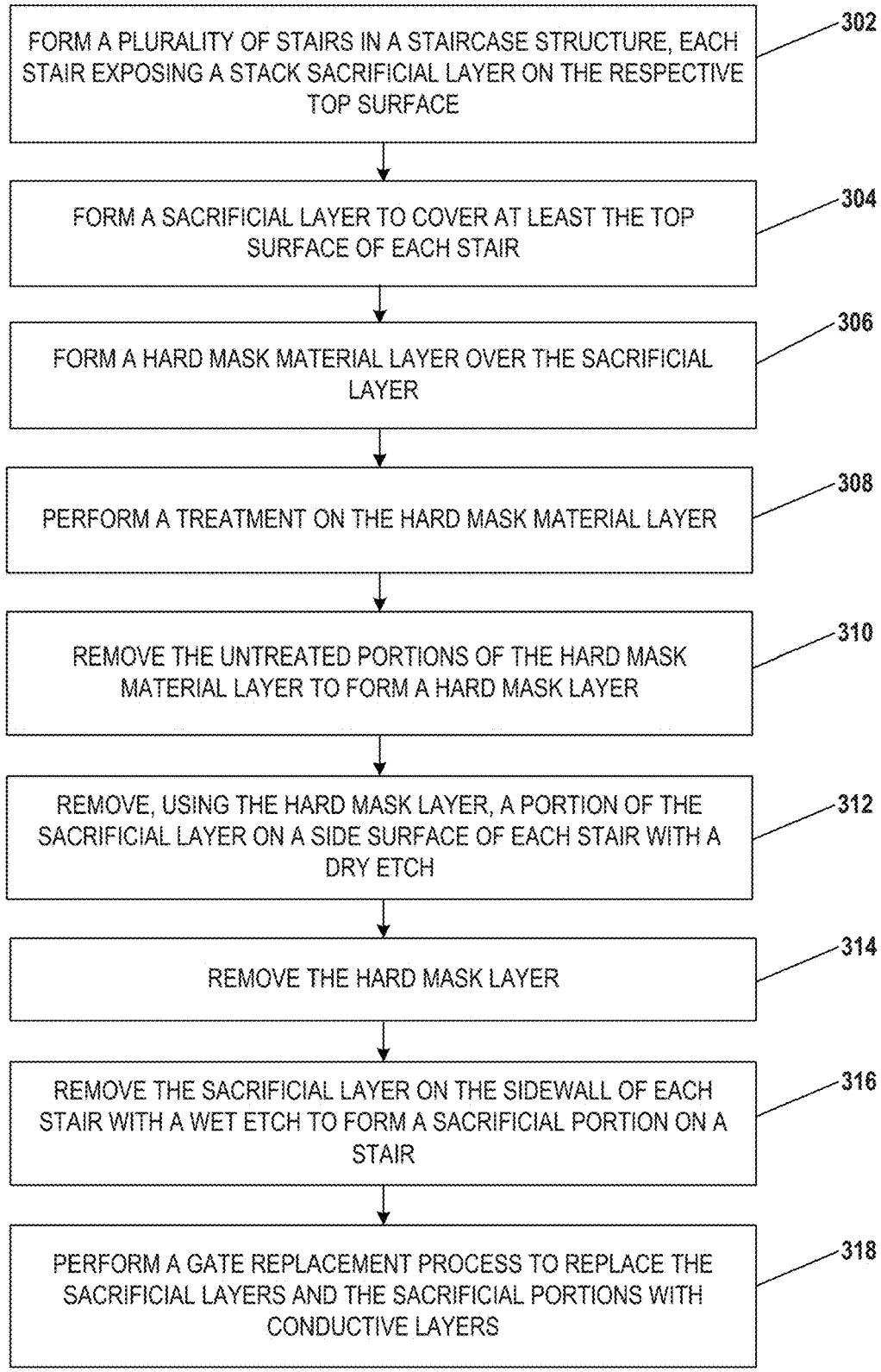
FIG. 3 illustrates a flowchart of an exemplary method for forming stairs in a 3D memory device, according to some implementations of the present disclosure.

FIGS. 2A-2J illustrate an exemplary fabrication method to form a plurality of stairs in a memory stack, according to some implementations. As an example, the fabrication process to form two consecutive stairs in a gate-last fabrication process is illustrated in FIG. 2A-2J. For simplicity of illustration, implementations of the present disclosure emphasize on the formation of stairs, e.g., thickening the conductive layers in contact with the contacts without forming voids in the conductive layers on the top surfaces of the stairs, and the fabrication process to form other parts are omitted from the description of FIGS. 2A-2J or simplified. FIG. 3 illustrates a flowchart of fabrication method 300 for forming the plurality of stairs, according to some implementations. It is understood that the operations shown in method 300 are not exhaustive and that other operations can be performed as well before, after, or between any of the illustrated operations. Further, some of the operations may be performed simultaneously, or in a different order than shown in FIGS. 2A-2J and 3.

Referring to FIG. 3, method 300 starts at operation 302, in which a stack structure having a plurality of stairs is formed, each stair exposing a stack sacrificial layer on the respective top surface. FIGS. 2A and 2B illustrate corresponding structures.

As shown in FIG. 2B, a staircase structure 202 having a plurality of stairs, e.g., 202-1 and 202-2, may be formed on a substrate (not shown). Staircase structure 202 may include a plurality of stack sacrificial layers 204 and a plurality of stack dielectric layers 206 stacked alternatingly in the z-axis (e.g., the vertical direction). Each stack sacrificial layer 204 and an underlying stack dielectric layer 206 may form a sacrificial/dielectric pair. In some implementations, each stair, e.g., 202-1 and 202-2, includes one or more sacrificial/dielectric pairs. That is, each stair may include one or more stack sacrificial layers 204 and one or more stack dielectric layers 206 arranged alternatingly along the vertical direction. In some implementations, each stair includes more than one sacrificial/dielectric pair. Stack sacrificial layers 204 and stack dielectric layers 206 may include different materials and thus can be selectively etched, e.g., in the gate-replacement process.

Staircase structure 202 can be formed by repetitively etching a stack structure having a plurality of interleaved initial dielectric layers and initial stack sacrificial layers using an etch mask, e.g., a patterned PR layer over the respective stack structure. Each initial stack sacrificial layer and the underlying initial dielectric layer may be referred to as a dielectric pair. The initial dielectric layers and the initial stack sacrificial layers may include different materials. In some implementations, the initial dielectric layers include silicon oxide, and the initial stack sacrificial layers include silicon nitride. In some implementations, one or more dielectric pairs can form one level/stair. During the formation of staircase structure 202, the PR layer is trimmed (e.g., etched incrementally and inwardly from the boundary of the material stack, often from all directions) and used as the etch mask for etching the exposed portion of the stack structure. The amount of trimmed PR can be directly related (e.g., determinant) to the dimensions of the stairs. The trimming of the PR layer can be obtained using a suitable etch, e.g., an isotropic etching process, such as wet etching. One or more PR layers can be formed and trimmed consecutively for the formation of staircase structure 202. Each dielectric pair can be etched, after the trimming of the PR layer, using suitable etchants to remove a portion of both the initial sacrificial layer and the underlying initial dielectric layer. The etched initial stack sacrificial layers and initial dielectric layers may respectively form stack sacrificial layers 204 and stack dielectric layers 206, which form stairs in the stack structure. Each stair, e.g., 202-1 and 202-2, may include a top surface and a side surface. The PR layer(s) can then be removed.

As shown in FIG. 2B, staircase structure 202 may be etched to expose stack sacrificial layer 204 on the top surface of each stair, 202-1 and 202-2, in staircase structure 202. Optionally, as shown in FIG. 2A, staircase structure 202 may be etched to expose stack dielectric layer 206 on the top surface of each stair, e.g., 202-1 and 202-2, and may subsequently undergo a trimming process to remove stack dielectric layer 206 on the top surface of each stair. Stack sacrificial layer 204 may then be exposed on the top surface of each stair, forming the structure shown in FIG. 2B. The trimming process may include a suitable etching process such as a dry etch and/or a wet etch. In some implementations, the side surface of each stair, e.g., 202-1 and 202-2, exposes one or more stack dielectric layers 206 and one or more stack sacrificial layer 204, including stack sacrificial layer 204 on the top surface of the respective stair.

Referring back to FIG. 3, after the formation of the staircase structure, method 300 proceeds to operation 304, in which a sacrificial layer is formed to cover at least the top surface of each stair. FIG. 2C illustrates a corresponding structure.

As shown in FIG. 2C, a sacrificial layer may be formed to cover at least the top surfaces of each stair, e.g., 202-1 and 202-2, of staircase structure 202. The sacrificial layer may cover at least the exposed stack sacrificial layers 204 on top surfaces of the stairs, e.g., 202-1 and 202-2. In some implementations, the sacrificial layer covers, e.g., partially or fully, top surfaces and side surfaces of each stair, e.g., 202-1 and 202-2, and is in contact with stack sacrificial layers 204 on the top surfaces. In some implementations, the sacrificial layer may include a plurality of first portions each deposited on the side surface of a stair (e.g., 202-1/202-2), and a plurality of second portions each deposited on the top surface of a stair (e.g., 202-1/202-2). In some implementations, the sacrificial layer includes a first sub-layer 208 in contact with the stairs (e.g., 202-1 and 202-2), and a second sub-layer 210 over and in contact with first sub-layer 208. In some implementations, each of first sub-layer 208 and second sub-layer 210 covers the side surface of a respective stair (e.g., 202-1/202-2). First and second sub-layers 208 and 210 may each include the same material as stack sacrificial layers 204. In some implementations, first and second sub-layers 208 and 210 have different etching selectivities in a wet etching process. In some implementations, first sub-layer 208 has a higher wet etch rate than second sub-layer 210. In some implementations, first and second sub-layers 208 and 210 have the same etch rate in a dry etching process. For ease of illustration, first sub-layer 208 may include a plurality of first portions 208-1 each deposited on the side surface of a stair (e.g., 202-1/202-2), and a plurality of second portions 208-2 each deposited on the top surface of the respective stair (e.g., 202-1/202-2); second sub-layer 210 may include a plurality of first portions 210-1 each deposited on the side surface of a stair (e.g., 202-1/202-2), and a plurality of second portions 210-2 each deposited on the top surface of the respective stair (e.g., 202-1/202-2). As shown in FIG. 2C, first portion 210-1 of second sub-layer 210 may over and in contact with first portion 208-1 of first sub-layer 208, and second portion 210-2 of second sub-layer 210 may over and in contact with second portion 208-2 of first sub-layer 208.

In some implementations, first sub-layer 208 and second sub-layer 210 of the sacrificial layer each includes the same sacrificial material as stack sacrificial layers 204. In some implementations, stack sacrificial layers 204 and the sacrificial layer include silicon nitride. The sacrificial layer may be desirably thick for a conductive layer with a desired thickness to be formed in the subsequent gate-replacement operation. In some implementations, suitable deposition methods such as atomic layer deposition (ALD), chemical vapor deposition (CVD), and/or physical vapor deposition (PVD) may be employed to form first sub-layer 208 and second sub-layer 210. In some implementations, fabrication conditions, such as pressure, gas flow rates, and temperature in the deposition of first and second sub-layers 208 and 210 may be varied to form first and second sub-layers 208 and 210 of different etch selectivities.

Referring back to FIG. 3, after the formation of the sacrificial layer, method 300 proceeds to operation 306, in which a hard mask material layer is formed over the sacrificial layer. FIG. 2D illustrates a corresponding structure.

As shown in FIG. 2D, a hard mask material layer 212 is deposited over the sacrificial layer, e.g., second sub-layer 210 of the sacrificial layer. Hard mask material layer 212 may cover the top and side surfaces of each stair (e.g., 202-1/202-2). Hard mask material layer 212 may include any suitable material that can be employed as a hard mask for the subsequent patterning of the sacrificial layer. In some implementations, hard mask material layer 212 includes carbon and/or polysilicon. For example, hard mask material layer 212 may include a layer of carbon. In some implementations, suitable deposition methods such as ALD, CVD, and/or PVD may be employed to form hard mask material layer 212. In some implementations, a soft mask material layer (not shown) is formed between hard mask material layer 212 and the sacrificial layer. In some implementations, the soft mask material layer is employed to form a soft mask layer, with which the removal of the subsequently-formed hard mask layer can be easier. The soft mask material layer may include any suitable materials such as photoresist and can be formed by a suitable method such as spin-on coating.

Referring back to FIG. 3, after the formation of the hard mask material layer, method 300 proceeds to operation 308, in which a treatment is performed on the hard mask material layer. FIG. 2E illustrates a corresponding structure.

As shown in FIG. 2E, a treatment is performed on hard mask material layer 212 to form a plurality of treated portions 212-1 each on the top surface of a stair (e.g., 202-1/202-2), and a plurality of untreated portions 212-2 each on the side surface of the respective stair (e.g., 202-1/202-2). In some implementations, for each stair (e.g., 202-1/202-2), treated portion 212-1 is in contact with the respective untreated portion 212-2. The treatment may alter certain material properties of treated portions 212-1 such that they can sustain the subsequent ashing process and be retained. For example, treated portions 212-1 may be hardened by the treatment, and untreated portions 212-2 may preserve original material properties. In some implementations, the treatment includes at least one of an ion implantation process and a thermal treatment, such as annealing. In some implementations, the portions of hard mask material layer 212 that cannot be bombarded by the ions of the ion implantation may form untreated portions 212-2, e.g., each covered by the respective treated portion 212-1 in the z-axis. In some implementations, untreated portion 212-2 (e.g., on stair 202-1) may be in contact with treated portion 212-1 of the immediate-lower stair (e.g., stair 202-2).

Referring back to FIG. 3, after the formation of the treated portions and untreated portions of the hard mask material layer, method 300 proceeds to operation 310, in which the untreated portions of the hard mask material layer are removed to form a hard mask layer. FIG. 2F illustrates a corresponding structure.

As shown in FIG. 2F, untreated portions 212-2 of hard mask material layer 212 may be removed. Treated portions 212-1 of hard mask material layer 212 may be retained to from a hard mask layer. As shown in FIG. 2F, the hard mask layer may partially cover the top surface of each stair (e.g., 202-1/202-2), and may expose the side surface of each stair (e.g., 202-1/202-2). A portion of second portion 210-2 of second sub-layer 210 (e.g., on stair 202-2) neighboring the side surface of an immediate-upper stair (e.g., stair 202-1) may be exposed by the hard mask layer. In some implementations, untreated portions 212-2 of hard mask material layer 212 are removed by an ashing process. In some implementations, a soft mask material layer, if formed, may also be patterned to form a soft mask layer by a suitable process such as an ashing process to expose the side surface of each stair (e.g., 202-1/202-2).

Referring back to FIG. 3, after the formation of the hard mask layer, method 300 proceeds to operation 312, in which the hard mask layer is employed as an etch mask to remove a portion of the sacrificial layer on a side surface of each stair with a dry etch. FIG. 2G illustrates a corresponding structure.

As shown in FIG. 2G, the hard mask layer may be employed as an etch mask to perform an anisotropic etching process, e.g., a dry etch, to remove a portion of the sacrificial layer on the side surface of each stair (e.g., 202-1/202-2). First portion 208-1 of first sub-layer 208 may be exposed. In some implementations, first portion 210-1 of second sub-layer 210 may be fully removed. First portion 208-1 of first sub-layer 208 may or may not be partially removed. In some implementations, first portion 208-1 of first sub-layer 208 (e.g., on stair 202-2), in contact with the side surface of an immediate-upper stair (e.g., stair 202-1), is partially or fully retained after the dry etch such that the underlying stack sacrificial layer 204 is not exposed. In some implementations, second portion 210-2 of second sub-layer 210 (e.g., on stair 202-2), in contact with the side surface of an immediate-upper stair (e.g., stair 202-1), is partially or fully retained. In some implementations, the dry etch may be controlled, e.g., timed, to allow a sufficient thickness of the sacrificial layer (e.g., first portion 208-1 of first sub-layer 208 and/or second portion 210-2 of second sub-layer 210) to be retained.

Referring back to FIG. 3, after the partial removal of the sacrificial layer, method 300 proceeds to operation 314, in which the hard mask layer is removed. FIG. 2H illustrates a corresponding structure.

As shown in FIG. 2H, the hard mask layer may be removed by a suitable ashing and/or etching process. In some implementations, a soft mask layer, if formed, is also removed. For example, a soft mask layer including photoresist can be removed by an ashing process and/or a lift-off process. After the removal of the hard mask layer (and the soft mask layer, if any), the rest of the sacrificial layer can be exposed on the stairs (e.g., 202-1/202-2). In some implementations, first portion 208-1 of first sub-layer 208 may be exposed on the side surface of the respective stair (e.g., 202-1/202-2). In some implementations, second portion 210-2 of second sub-layer 210 may be exposed on the top surface of the respective stair (e.g., 202-1/202-2). In some implementations, second portion 210-2 of second sub-layer 210 (e.g., on stair 202-2) is in contact with first portion 208-1 of first sub-layer 208 of the immediate-upper stair (e.g., stair 202-1).

Referring back to FIG. 3, after the removal of the hard mask layer, method 300 proceeds to operation 316, in which portions of the sacrificial layer on the side surfaces of each stair is removed with a wet etching process to form a sacrificial portion on a stair. FIG. 2I illustrates a corresponding structure.

As shown in FIG. 2I, any remaining first portion 208-1 of first sub-layer 208 on the side surface of each stair (e.g., 202-1/202-2) may be removed using an isotropic etching process, such as a wet etch. In some implementations, after each first portion 208-1 of first sub-layer 208 is removed, a sacrificial portion, including at least the retained second portion 208-2 of first sub-layer 208, is formed on the top surface of each stair (e.g., 202-1/202-2). In some implementations, the sacrificial portion includes the retained second portion 208-2 of first sub-layer 208 and second portion 210-2 of second sub-layer 210. The sacrificial portion may be in contact with the underlying stack sacrificial layer 204. In some implementations, the sacrificial portion (e.g., on stair 202-2) may be in contact with the side surface of the immediate-upper stair (e.g., stair 202-1). In some implementations, at least one of second portion 208-2 of first sub-layer 208 and second portion 210-2 of second sub-layer 210 (e.g., on stair 202-2) is in contact with the bottom stack dielectric layer 206 of the immediate-upper stair (e.g., stair 202-1). Because the etch rate of first sub-layer 208 is higher than the etch rate of second sub-layer 210 in a wet etch, in some implementations, first portions 208-1 of first sub-layer 208 may be fully removed before second portions 210-2 of second sub-layer 210 is etched away. A desired thickness of the sacrificial portion can be retained on the top surface of each stair (e.g., 202-1/202-2).

Referring back to FIG. 3, after the formation of sacrificial portions, method 300 proceeds to operation 318, in which a gate replacement process is performed to replace the plurality of stack sacrificial layers and the sacrificial portions with conductive layers. FIG. 2J illustrates a corresponding structure.

As shown in FIG. 2J, a gate replacement process may be performed to replace the plurality of stack sacrificial layers 204 and the sacrificial portions (second portion 208-2 of first sub-layer 208 and second portion 210-2 of second sub-layer 210) with a plurality of conductive layers 214. Stack dielectric layer 206 may also be referred to as dielectric layer 206. A memory stack, including interleaved conductive layers 214 and dielectric layers 206, may be formed. In some implementations, conductive layer 214 on the top surface of each stair (e.g., 202-1/202-2) includes a top portion 214-1 and a bottom portion 214-2. Top portion 214-1 (e.g., of stair 202-2) may be in contact with the side surface, e.g., stack dielectric layer 206, of the immediate-upper stair (e.g., stair 202-1). In some implementations, in the x-axis, the dimension, e.g., width, of top portion 214-1 is the same as that of the respective stair. Bottom portion 214-2, in contact with the respective top portion 214-1, may extend in the x- and y-axes, and may be in contact with an underlying stack dielectric layer 206. Top portion 214-1 may be formed from a respective sacrificial portion, and bottom portion 214-2 may be formed from a respective stack sacrificial layer 204. In some embodiments, a thickness of bottom portion 214-2 in the z-axis is uniform in stair 202-2 and beyond stair 202-2, e.g., under stair 202-1.

In the gate replacement process, an isotropic etching process, e.g., a wet etch, may be performed to remove stack sacrificial layers 204 and the sacrificial portions. A plurality of lateral recesses may be formed in staircase structure 202. A conductor material, e.g., W, Co, Al, Cu, polysilicon (e.g., doped silicon), and/or silicides, may be deposited to fill up the lateral recesses, forming conductive layers 214. The conductor material can be deposited using any suitable deposition method such as CVD, PVD, ALD, or a combination thereof.

In some implementations, an insulating structure 218 is formed over staircase structure 202 such that staircase structure 202 is in insulating structure 218. In some implementations, insulating structure 218 is deposited over staircase structure 202 before the gate replacement process. Insulating structure 218 may be in contact with the top surfaces of the stairs (or top portions 214-1 of conductive layer 214). Insulating structure 218 may include any suitable insulating material(s) such as silicon oxide and can be formed by any suitable deposition process(es) such as CVD, PVD, and/or ALD. An opening, for forming a contact, may be formed to extend in insulating structure 218 and expose the top surface of a respective stair (e.g., 202-1/202-2). A suitable conductive material, e.g., W, Co, Al, Cu, doped silicon, and/or silicides, may be deposited to fill up the opening and form a contact 216. The conductive material can be deposited using any suitable deposition method such as CVD, PVD, ALD, or a combination thereof. Optionally, a planarization process, such as a chemical mechanical planarization and/or a wet etch, can be performed on the top surface of insulating structure 218 to remove any excess insulating material(s) and/or conductive material(s).

Figure 5:
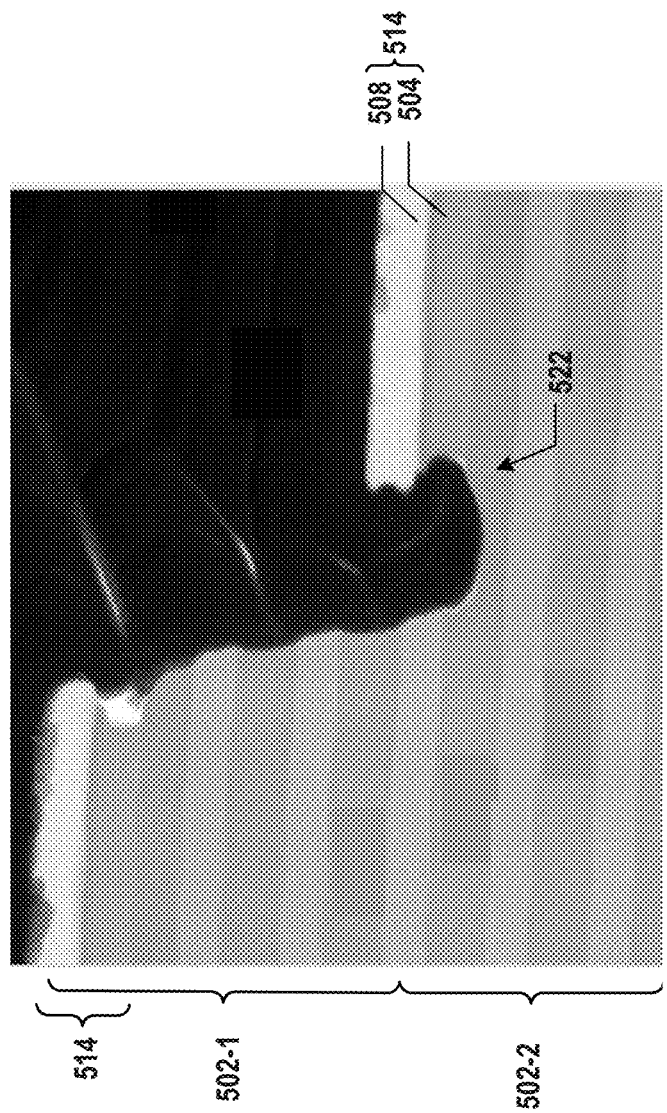
FIG. 5 illustrates an electron microscope (EM) image of a 3D memory device.
Figure 6:
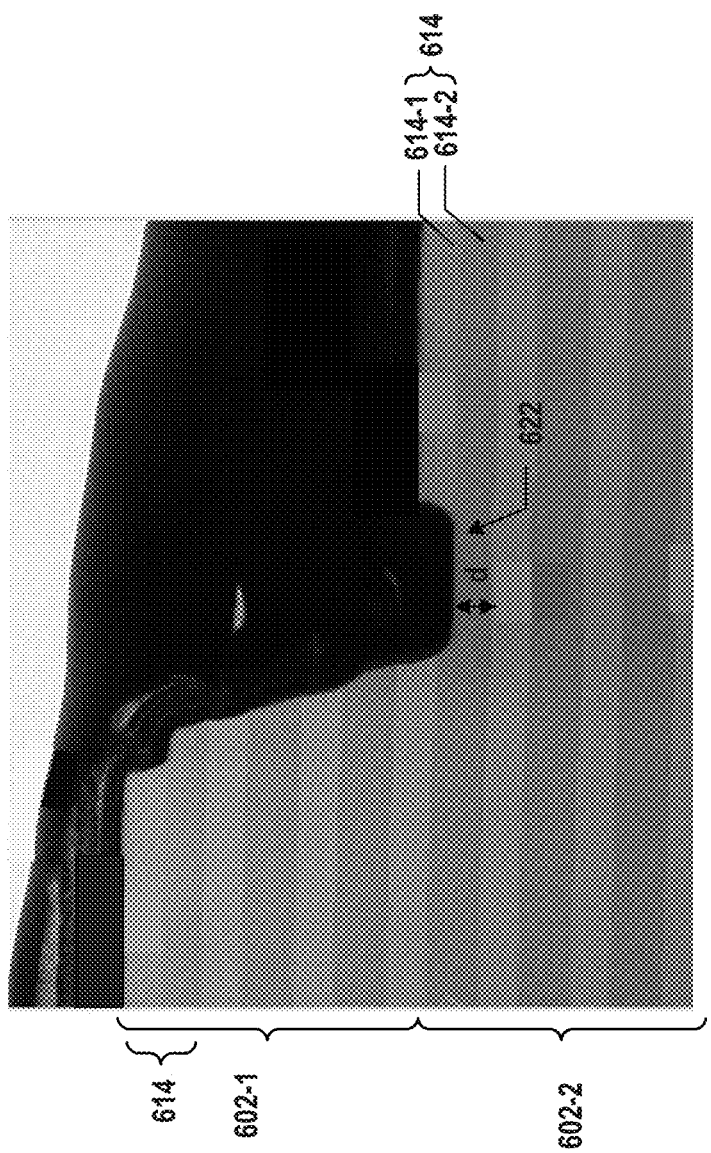
FIG. 6 illustrates an EM image of a 3D memory device, according to some implementations of the present disclosure.

FIG. 5 illustrates an EM image of two consecutive stairs 502-1 and 502-2 having a void 522 between the side surface of stair 502-1 and a sacrificial portion 508 on the top surface of stair 502-2. Sacrificial portion 508 is located on a stack sacrificial layer 504. Sacrificial portion 508 and stack sacrificial layer 504 form a sacrificial layer 514 that is to be replaced with a conductive layer in a gate-replacement process. Sacrificial portion 508 is replaced with a top portion of the conductive layer, and stack sacrificial layer 504 is replaced with a bottom portion of the conductive layer. As shown FIG. 5, void 522, caused by over etch, damages stack sacrificial layer 504 such that stack sacrificial layer 504 (e.g., and the conductive layer) becomes thinner or even disconnected at the location of the over etch. The resistance of the conductive layer can undesirably increase. FIG. 6 illustrates an EM image of two consecutive stairs 602-1 and 602-2 formed using the method of the present disclosure. As shown in FIG. 6, a void 622 is formed between the side surface of stair 602-1 and a sacrificial portion 614-1 (e.g., second portion 210-2 of second sub-layer 210 and second portion 208-2 of first sub-layer 208) on the top surface of stair 602-2. Sacrificial portion 614-1 and stack sacrificial layer 614-2 form a sacrificial layer 614 that is to be replaced with a conductive layer in a gate-replacement process. Sacrificial portion 614-1 is replaced with a top portion of the conductive layer, and stack sacrificial layer 614-2 is replaced with a bottom portion of the conductive layer. Compared to void 522, void 622 is shallower in the z-direction such that a thickness d of stack sacrificial layer 614-2 is uniform in stair 602-2 and beyond stair 602-2 (e.g., in stair 602-1). For example, stack sacrificial layer 614-2 has little or no damage by void 622 that stack sacrificial layer 614-2 has a uniform thickness d. that is, void 622, formed using the method of the present disclosure, is desirably shallow to reduce the risk of the over etching of stack sacrificial layer 614-2. Accordingly, the bottom portion of the conductive layer has a uniform thickness in and beyond the respective stair. The increase in resistance of conductive layer 614 on the top surface of stair 602-2 may be reduced/minimized.

In some implementations, in a gate-first process, a plurality stack conductive layers and a plurality of dielectric layers are formed interleaved above a substrate, forming a stack structure. The stack conductive layers and the dielectric layers may be repeatedly patterned to form a staircase structure. A conductive layer, having the same material as the stack conductive layer, may be formed covering the top surfaces and side surfaces of the stairs. In some implementations, the stack conductive layers and the conductive layer include at least one of W, Co, Al, Cu, doped silicon, and/or silicides. In some implementations, the stack conductive layers and the conductive layer include doped polysilicon. In some implementations, the conductive layer includes a first sub-layer and a second sub-layer over the first sub-layer. The etch rates of the first and second sub-layers may be the same in a dry etch, and the etch rate of the first sub-layer may be higher than that of the second sub-layer. The conductive layer may be patterned, using the same or similar patterning process as described in the present disclosure, to form a conductive portion on each stair, with improved etch control. In some implementations, the conductive portion includes a portion of the first sub-layer and a portion of the second sub-layer. The conductive portion may be in contact with the underlying stack conductive layer at the top surface of each stair. In some implementations, the conductive portion is in contact with the side surface (e.g., a bottom dielectric layer) of an immediate-upper stair. In some implementations, a dimension of the conductive portion is the same as that of the respective stair at least in the lateral direction the stairs extend. Little or no void may be formed between the side surface of a stair and the conductive portion of an immediate-lower stair. In some implementations, the conductive portion forms the top portion of a conductive layer at the top surface of each stair, and the stack conductive layer forms the bottom portion of the conductive layer. A conductive layer at the top surface of each stair may be formed by the conductive portion and the underlying stack conductive layer.

The present disclosure provides a method for forming a 3D memory device. The method includes forming a stack structure having interleaved a plurality of stack first layers and a plurality of stack second layers, forming a stair in the stack structure, the stair having one of the stack first layers on a top surface, and forming a layer of sacrificial material having a first portion over a side surface of the stair and a second portion over the top surface of the stair. The method also includes partially removing the first portion of the layer of sacrificial material using an anisotropic etching process and removing a remaining portion of the first portion of the layer of sacrificial material using an isotropic etching process.

In some implementations, the second portion of the layer of sacrificial material is on the top surface of the stair and is in contact with a side surface of an immediate-upper stair.

In some implementations, the anisotropic etching process includes a dry etch and the isotropic etching process includes a wet etch.

In some implementations, the plurality of stack first layers each includes a stack sacrificial layer, and the plurality of stack second layers each includes a stack dielectric layer.

In some implementations, the layer of sacrificial material includes a first sub-layer in contact with the stair and a second sub-layer in contact with and over the first sub-layer.

In some implementations, the first sub-layer and the second sub-layer each includes the sacrificial material that is replaced with a conductive material in a gate-replacement process.

In some implementations, deposition conditions of the first sub-layer and the second sub-layer are different, such that an etch rate of the first sub-layer is higher than an etch rate of the second sub-layer using the isotropic etching process. The deposition conditions includes at least one of a pressure, a gas flow rate, or a temperature.

In some implementations, an etch rate of the first sub-layer is the same as an etch rate of the second sub-layer using the anisotropic etching process.

In some implementations, removing, partially, the first portion of the layer of sacrificial material includes removing at least a portion of the second sub-layer on the side surface of the stair to expose the first sub-layer.

In some implementations, removing the remaining portion of the first portion of the layer of sacrificial material includes removing an exposed portion of the first sub-layer to expose the side surface of the stair.

In some implementations, the method further includes replacing the plurality of stack first layers and the second portion of the layer of sacrificial material with a plurality of conductive layers.

In some implementations, the plurality of stack first layers each includes a stack conductive layer, and the plurality of stack second layers each includes a stack dielectric layer.

In some implementations, the layer of sacrificial material includes a same material as the stack first layers.

In some implementations, the method further includes partially removing the first portion of the layer of sacrificial material using a hard mask layer over the top surface of the stair and exposes the side surface of the stair.

In some implementations, forming the hard mask layer includes forming, before removing the first portion of the layer of sacrificial material, a hard mask material layer over the layer of sacrificial material on the top and side surfaces of the stair. In some implementations, forming the hard mask layer also includes performing a treatment on the hard mask material layer to form a treated portion of the hard mask material layer on the top surface of the stair and removing an untreated portion of the hard mask material layer on the side surface of the stair to expose the layer of sacrificial material on the side surface of the stair, the treated portion of the hard mask material layer being retained to form the hard mask layer.

In some implementations, removing the untreated portion of the hard mask material layer includes an ashing process.

In some implementations, the further includes removing the hard mask layer before removing the remaining portion of the first portion of the layer of sacrificial material.

The present disclosure also includes a method for forming a 3D memory device. The method includes forming a stack structure having a plurality of stairs that includes interleaved a plurality of stack first layers and a plurality of stack second layers. Each of the stairs includes one of the stack first layers on a top surface. The method also includes forming a layer of sacrificial material having a first portion over a side surface of the stair and a second portion over the top surface of the stair, and removing, using at least an isotropic etching process, the first portion of the layer of sacrificial material to expose the side surface of the stair. The method further includes retaining the second portion of the layer of sacrificial material in the isotropic etching process.

In some implementations, the second portion retained includes (i) a top portion and (ii) a bottom portion in contact with the top portion and one of the stack second layers in the respective stair. The bottom portion in the respective stair has a same thickness with the stack first layer beyond the respective stair.

In some implementations, the second portion of the layer of sacrificial material is in contact with a side surface of an immediate-upper stair.

In some implementations, removing, using at least the isotropic etching process, the first portion of the layer of sacrificial material includes partially removing the first portion of the layer of sacrificial material using an anisotropic etching process and removing a remaining portion of the first portion of the layer of sacrificial material using the isotropic etching process.

In some implementations, the anisotropic etching process includes a dry etch and the isotropic etching process includes a wet etch.

In some implementations, the plurality of stack first layers each includes a stack sacrificial layer, and the plurality of stack second layers each includes a stack dielectric layer.

In some implementations, the layer of sacrificial material includes a first sub-layer in contact with the stair and a second sub-layer in contact with and over the first sub-layer.

In some implementations, the first sub-layer and the second sub-layer each includes the sacrificial material that is replaced with a conductive material in a gate-replacement process.

In some implementations, deposition conditions of the first sub-layer and the second sub-layer are different such that an etch rate of the first sub-layer is higher than an etch rate of the second sub-layer using the isotropic etching process. The deposition conditions includes at least one of a pressure, a gas flow rate, or a temperature.

In some implementations, an etch rate of the first sub-layer is the same as an etch rate of the second sub-layer using the anisotropic etching process.

In some implementations, removing, partially, the first portion of the layer of sacrificial material includes removing at least a portion of the second sub-layer on the side surface of the stair to expose the first sub-layer.

In some implementations, removing the remaining portion of the first portion of the layer of sacrificial material includes removing an exposed portion of the first sub-layer to expose the side surface of the stair.

In some implementations, the method further includes replacing the plurality of stack first layers and the second portion of the layer of sacrificial material with a plurality of conductive layers.

In some implementations, the plurality of stack first layers each includes a stack conductive layer, and the plurality of stack second layers each includes a stack dielectric layer.

In some implementations, the layer of sacrificial material includes a same material as the stack first layers.

In some implementations, the method further includes partially removing the first portion of the layer of sacrificial material using a hard mask layer over the top surface of the stair and exposes the side surface of the stair.

In some implementations, forming the hard mask layer includes forming, before removing the first portion of the layer of sacrificial material, a hard mask material layer over the layer of sacrificial material on the top and side surfaces of the stair. In some implementations, forming the hard mask layer also includes performing a treatment on the hard mask material layer to form a treated portion of the hard mask material layer on the top surface of the stair and removing an untreated portion of the hard mask material layer on the side surface of the stair to expose the layer of sacrificial material on the side surface of the stair. The treated portion of the hard mask material layer is retained to form the hard mask layer.

In some implementations, removing the untreated portion of the hard mask material layer includes an ashing process.

In some implementations, the method further includes removing the hard mask layer before removing the remaining portion of the first portion of the layer of sacrificial material.

The present disclosure further discloses a 3D memory device that includes a memory stack having a plurality of stairs each including interleaved one or more conductive layers and one or more dielectric layers. Each of the stairs includes one of the conductive layers on a top surface of the stair, the one of the conductive layers having a top portion and a bottom portion in contact with the top portion and one of the dielectric layers in the respective stair. The bottom portion in the respective stair has a same thickness with the stack conductive layer beyond the respective stair.

In some implementations, the top portion is in contact with a side surface of one of the dielectric layers in an immediate-upper stair.

In some implementations, the method further includes an insulating structure in which the memory stack is located and a contact extending in the insulating structure and in contact with the top portion of a respective one of the conductive layers.

In some implementations, the one or more conductive layers includes at least one of tungsten (W), aluminum (Al), copper (Cu), cobalt (Co), silicides, or polysilicon.

The foregoing description of the specific implementations will so reveal the general nature of the present disclosure that others can, by applying knowledge within the skill of the art, readily modify and/or adapt for various applications such specific implementations, without undue experimentation, without departing from the general concept of the present disclosure. Therefore, such adaptations and modifications are intended to be within the meaning and range of equivalents of the disclosed implementations, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Implementation of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The breadth and scope of the present disclosure should not be limited by any of the above-described exemplary implementations, but should be defined only in accordance with the following claims and their equivalents.

What is claimed is:

1. A method for forming a three-dimensional (3D) memory device, comprising:
    forming a stack structure comprising interleaved a plurality of stack first layers and a plurality of stack second layers;
    forming a stair in the stack structure, the stair comprising one of the stack first layers on a top surface;
    forming a layer of sacrificial material comprising a first portion over a side surface of the stair and a second portion over the top surface of the stair;
    forming a hard mask material layer over the layer of sacrificial material on the top and side surfaces of the stair;
    performing a treatment the hard mask material layer to form a treated portion of the hard mask material layer laterally extending on the second portion of the layer of sacrificial material;
    removing an untreated portion of the hard mask material layer covering the side surface of the stair to expose the first portion of the layer of sacrificial material;
    using the treated portion of the hard mask material layer as an etch mask to partially remove the first portion of the layer of sacrificial material using an anisotropic etching process; and
    removing a remaining portion of the first portion of the layer of sacrificial material using an isotropic etching process.

2. The method of claim 1, wherein the second portion of the layer of sacrificial material is on the top surface of the stair and is in contact with a side surface of an immediate-upper stair.

3. The method of claim 1, wherein the anisotropic etching process comprises a dry etch and the isotropic etching process comprises a wet etch.

4. The method of claim 1, wherein the plurality of stack first layers each comprises a stack sacrificial layer, and the plurality of stack second layers each comprises a stack dielectric layer.

5. The method of claim 4, wherein the layer of sacrificial material comprises a first sub-layer in contact with the stair and a second sub-layer in contact with and over the first sub-layer.

6. The method of claim 5, wherein the first sub-layer and the second sub-layer each comprises the sacrificial material that is replaced with a conductive material in a gate-replacement process.

7. The method of claim 6, wherein deposition conditions of the first sub-layer and the second sub-layer are different, such that an etch rate of the first sub-layer is higher than an etch rate of the second sub-layer using the isotropic etching process, the deposition conditions comprising at least one of a pressure, a gas flow rate, or a temperature.

8. The method of claim 5, wherein an etch rate of the first sub-layer is the same as an etch rate of the second sub-layer using the anisotropic etching process.

9. The method of claim 5, wherein removing, partially, the first portion of the layer of sacrificial material comprises removing at least a portion of the second sub-layer on the side surface of the stair to expose the first sub-layer.

10. The method of claim 9, wherein removing the remaining portion of the first portion of the layer of sacrificial material comprises removing an exposed portion of the first sub-layer to expose the side surface of the stair.

11. The method of claim 1, wherein the plurality of stack first layers each comprises a stack conductive layer, and the plurality of stack second layers each comprises a stack dielectric layer.

12. The method of claim 11, wherein the layer of sacrificial material comprises a same material as the stack first layers.

13. The method of claim 1, wherein removing the untreated portion of the hard mask material layer comprises performing an ashing process.

14. The method of claim 1, wherein after removing the untreated portion of the hard mask material layer, the treated portion of the hard mask material layer partially covers and extends laterally beyond the second portion of the layer of sacrificial material.

15. The method of claim 1, further comprising:
removing the treated portion of the hard mask material layer after the anisotropic etching process and before the isotropic etching process.

16. A method for forming a three-dimensional (3D) memory device, comprising:
forming a stack structure comprising interleaved stack first layers and stack second layers;
forming a staircase structure comprising stairs at an edge of the stack structure, each stair having one of the stack first layers on a top surface of the stair;
forming a layer of sacrificial material comprising vertical portions covering side surfaces of the stairs and lateral portions covering the top surfaces of the stairs;
forming a hard mask material layer covering the vertical portions and the lateral portions of the layer of sacrificial material;
performing a treatment to the hard mask material layer to form lateral treated portions of the hard mask material layer each partially covering one corresponding lateral portion of the layer of sacrificial material;
removing vertical untreated portions of the hard mask material layer to expose the vertical portions of the layer of sacrificial material;
using the lateral treated portions of the hard mask material layer as an etch mask to remove a first sublayer of the vertical portions of the layer of sacrificial material using a first etching process;
removing the lateral treated portions of the hard mask material layer; and
removing a second sublayer of the vertical portions of the layer of sacrificial material using a second etching process different from the first etching process.

17. The method of claim 16, wherein removing the vertical untreated portions of the hard mask material layer comprises performing an ashing process.

18. The method of claim 16, wherein each lateral treated portion of the hard mask material layer extends laterally beyond the lateral portion of the layer of sacrificial material.

19. The method of claim 16, wherein the first etching process comprises a dry etch and the second etching process comprises a wet etch.

20. The method of claim 16, wherein a first etch rate of the first sublayer is higher than a second etch rate of the second sublayer during the second etching process.

* * * * *